(12) United States Patent
Hussell

(10) Patent No.: US 7,923,739 B2
(45) Date of Patent: Apr. 12, 2011

(54) SOLID STATE LIGHTING DEVICE

(75) Inventor: Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/479,318

(22) Filed: Jun. 5, 2009

(65) Prior Publication Data

US 2010/0133554 A1   Jun. 3, 2010

(51) Int. Cl.
*H01L 33/00* (2010.01)
(52) U.S. Cl. ............ 257/88; 257/99; 257/E21.499
(58) Field of Classification Search .......... 257/88, 257/99, E21.499, E33.056; 438/26
See application file for complete search history.

(56) References Cited

U.S. PATENT DOCUMENTS

| | | | |
|---|---|---|---|
| 4,679,118 A | 7/1987 | Johnson et al. | |
| 6,610,563 B1 | 8/2003 | Waitl | |
| 6,943,433 B2 | 9/2005 | Kamada | |
| D514,073 S | 1/2006 | Suenaga | |
| 7,081,661 B2 | 7/2006 | Takehara et al. | |
| 7,224,047 B2 | 5/2007 | Carberry et al. | |
| 7,244,965 B2 | 7/2007 | Andrews et al. | |
| 7,249,790 B2 | 7/2007 | Potts | |
| D566,055 S | 4/2008 | Kim | |
| D573,113 S | 7/2008 | Bando | |
| D573,114 S | 7/2008 | Min et al. | |
| 7,400,049 B2 | 7/2008 | Shim | |
| 7,432,589 B2 | 10/2008 | Yamamoto et al. | |
| D580,375 S | 11/2008 | Yen | |
| D580,381 S | 11/2008 | Bando | |
| D580,891 S | 11/2008 | Sung et al. | |
| 7,456,499 B2 * | 11/2008 | Loh et al. ................. 257/710 |
| 7,462,870 B2 | 12/2008 | Nakashima | |
| D584,699 S | 1/2009 | Bando | |
| D594,827 S | 6/2009 | Loh et al. | |
| D595,675 S | 7/2009 | Wang et al. | |
| 7,564,180 B2 | 7/2009 | Brandes | |
| D597,971 S | 8/2009 | Kobayakawa et al. | |
| D598,400 S | 8/2009 | Bando | |
| D614,592 S | 4/2010 | Hussell et al. | |
| D615,504 S | 5/2010 | Keller et al. | |
| 7,719,024 B2 * | 5/2010 | Bando ............... 257/99 |
| D621,798 S | 8/2010 | Lu et al. | |
| D621,799 S | 8/2010 | Hussell et al. | |
| 2002/0004251 A1 | 1/2002 | Roberts et al. | |

(Continued)

OTHER PUBLICATIONS

Nichia Corporation , "Nichia Model No. NS6G083 No. 070524765501 Specifications", "Model NSG083", 2008, p. 11, Publisher: Nichia Corporation.

(Continued)

*Primary Examiner* — Roy K Potter
(74) *Attorney, Agent, or Firm* — Jenkins, Wilson, Taylor & Hunt, P.A.

(57) ABSTRACT

A light emission package includes at least one solid state emitter, a leadframe, and a body structure encasing a portion of the leadframe. At least one aperture is defined in an electrical lead to define multiple electrical lead segments, with at least a portion of the aperture disposed outside an exterior side wall of the package. A recess may be defined in the exterior side wall to receive a bent portion of an electrical lead. A body structure cavity may be bounded by a floor, and side wall portions and end wall portions that are separated by transition wall portions including a curved or segmented upper edge, with different wall portions being disposed at different angles of inclination.

20 Claims, 9 Drawing Sheets

U.S. PATENT DOCUMENTS

| | | | |
|---|---|---|---|
| 2004/0126913 A1* | 7/2004 | Loh | 438/26 |
| 2006/0220050 A1 | 10/2006 | Higaki et al. | |
| 2007/0075325 A1 | 4/2007 | Baek et al. | |
| 2008/0006837 A1 | 1/2008 | Park et al. | |
| 2008/0185605 A1 | 8/2008 | Wada et al. | |
| 2008/0258162 A1 | 10/2008 | Koung et al. | |
| 2008/0290353 A1 | 11/2008 | Medendorp, Jr. et al. | |
| 2009/0189178 A1* | 7/2009 | Kim et al. | 257/99 |
| 2010/0133578 A1 | 6/2010 | Pickard et al. | |

OTHER PUBLICATIONS

Nichia Corporation, "Nichia Model No. NS6x083x No. 070702652613 Specifications", "Model NSx083x", 2008, p. 11, Publisher: Nichia Corporation.

U.S. Appl. No. 29/330,657.

U.S. Appl. No. 29/338,186.

Co-pending U.S. Appl. No. 12/535,353.

Co-pending U.S. Appl. No. 12/498,856.

U.S. Appl. No. 29/353,652, filed Jan. 12, 2010.

Notice of Allowance dated Apr. 16, 2010 from U.S. Appl. No. 29/338,186.

U.S. Appl. No. 29/360,791, filed Apr. 30, 2010.

U.S. Appl. No. 12/825,075, filed Apr. 30, 2010.

Chinese Notice of Patent Grant for CN 200930286397.5 dated May 19, 2010.

U.S. Appl. No. 12/853,812, filed Aug. 10, 2010.

Notice of Allowance for U.S. Appl. No. 29/353,652 dated Aug. 24, 2010.

Chinese Certificate of Design Patent for CN 200930286397.5 dated Oct. 6, 2010.

U.S. Appl. No. 61/404,985, filed Oct. 13, 2010.

Notice of Allowance for U.S. Appl. No. 29/353,652 dated Nov. 26, 2010.

U.S. Appl. No. 29/365,939, filed Jul. 16, 2010.

Supplemental Notice of Allowance for U.S. Appl. No. 29/353,652 dated Dec. 8, 2010.

Notice of Allowance for U.S. Appl. No. 29/360,791 dated Dec. 22, 2010.

Notice of Allowance for U.S. Appl. No. 29/365,939 dated Dec. 27, 2010.

U.S. Appl. No. 12/969,267 entitled "Solid State Lighting Devices and Methods" filed Dec. 15, 2010—inventor Christopher P. Hussell et al.

* cited by examiner

US 7,923,739 B2

SOLID STATE LIGHTING DEVICE

FIELD OF THE INVENTION

The present invention relates to solid state light emitters, including packages for solid state light emitters and devices incorporating same.

DESCRIPTION OF THE RELATED ART

Solid state light sources may be utilized to provide white LED light (e.g., perceived as being white or near-white), as has been investigated as potential replacements for white incandescent lamps. A representative example of a white LED lamp includes a package of a blue light emitting diode chip, made of gallium nitride (GaN), coated with a phosphor such as YAG. In such an LED lamp, the blue light emitting diode chip produces an emission with a wavelength of about 450 nm, and the phosphor produces yellow fluorescence with a peak wavelength of about 550 nm on receiving that emission. Part of the blue ray emitted from the blue LED chip passes through the phosphor, while part of the blue ray emitted from the blue LED chip is absorbed by the phosphor, which becomes excited and emits a yellow ray. The part of the blue light that is transmitted through the phosphor is mixed with the yellow light emitted by the phosphor. The viewer perceives the mixture of blue and yellow light as white light. As an alternative to phosphor-converted white light, red, blue, and green (RGB) solid state emitters may be operated in combination to produce light that is perceived as white.

A solid state lighting device may include, for example, an organic or inorganic light emitting diode ("LED") or a laser. Examples of packages as referenced above are disclosed in U.S. Patent Application Publication Nos. 2005/0269587, 2004/0126913, and 2004/0079957, which are commonly assigned to the same assignee of the present invention.

It is known to mount solid state light sources, such as semiconductor light emitting devices, in packages that may provide protection, color enhancement, focusing, and other utilities for light emitted by such sources. One example of a light emitting die package including at least one light emitting device, a molded body, a lead frame including multiple leads, a heatsink, and a lens is disclosed in U.S. Pat. No. 7,456,499, which is commonly assigned to the same assignee of the present invention. The molded body is formed around portions of the leadframe and defines an opening on the top side of the device, with the opening surrounding a mounting pad for at least one LED device.

Despite availability of various solid state light packages in the marketplace, need remains for improved packages suitable for solid state illumination applications, to enhance light output performance, enhance thermal performance, improve device reliability, and to promote ease of manufacture.

SUMMARY OF THE INVENTION

The present invention relates to solid state light emitters, including packages for solid state light emitters and devices incorporating same, and methods for forming solid state light emitter devices.

In one aspect, the invention relates to a light emission package adapted for use with at least one solid state emitter, the package comprising: (A) a leadframe defining at least one electrical lead; and (B) a body structure encasing at least a portion of the leadframe, the body structure defining at least one exterior side wall; wherein a first electrical lead of the at least one electrical lead includes a plurality of first electrical lead segments extending through the at least one exterior side wall, wherein each first electrical lead segment is separated from each other first electrical lead segment along the at least one exterior side wall by at least one first aperture, and at least a portion of the at least one first aperture is disposed outside the at least one exterior wall.

In another aspect, the invention relates to a light emission package adapted for use with at least one solid state emitter, the package comprising: (A) a leadframe defining at least one electrical lead; and (B) a body structure encasing at least a portion of the leadframe, the body structure defining at least one exterior side wall; wherein the at least one electrical lead extends through the at least one exterior side wall; and wherein the at least one exterior side wall defines at least one recess arranged to receive a bent portion of the at least one electrical lead.

In a further aspect, the invention relates to a method for fabricating a light emission package adapted for use with at least one solid state emitter, the method comprising: (A) forming a body structure to (i) encase at least a portion of a leadframe defining at least one electrical lead, and (ii) form at least one exterior side wall defining at least one recess; and (B) bending the at least one electrical lead to position at least a portion of the at least one electrical lead within the at least one recess. Such bending may be performed after forming of the body structure.

A further aspect of the invention relates to a method for fabricating a light emission package adapted for use with at least one solid state emitter, the method comprising: (A) defining in a leadframe at least one first aperture to yield a plurality of first electrical lead segments associated with a first electrical lead; (B) forming a body structure to (i) encase at least a portion of the leadframe and (ii) form at least one exterior side wall, wherein upon said forming of the body structure, each first electrical lead segment is separated from each other first electrical lead segment along the at least one exterior side wall by the at least one first aperture, and at least a portion of the at least one first aperture is disposed outside the at least one exterior wall; and (C) bending the plurality of first electrical lead segments. Such bending may be performed after forming of the body structure.

A still further aspect of the invention relates to a light emission package comprising: (A) at least one solid state emitter; (B) a heatsink element in thermal communication with the at least one solid state emitter; (C) a leadframe defining a plurality of electrical leads in electrical communication with the at least one solid state emitter; and (D) a body structure encasing at least a portion of the leadframe and arranged to retain the heatsink element, wherein the body structure defines a cavity, and the at least one solid state emitter is disposed within the cavity; wherein the cavity is bounded by a floor, side wall portions, end wall portions, and transition wall portions; wherein a transition wall portion is disposed between each respective side wall portion and end wall portion; and wherein each side wall portion and each end wall portion includes a substantially straight upper edge, and each transition wall portion includes a curved or segmented upper edge transitioning from the upper edge of a side wall portion to the upper edge of an end wall portion.

In a further aspect, any of the foregoing aspects may be combined for additional advantage.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
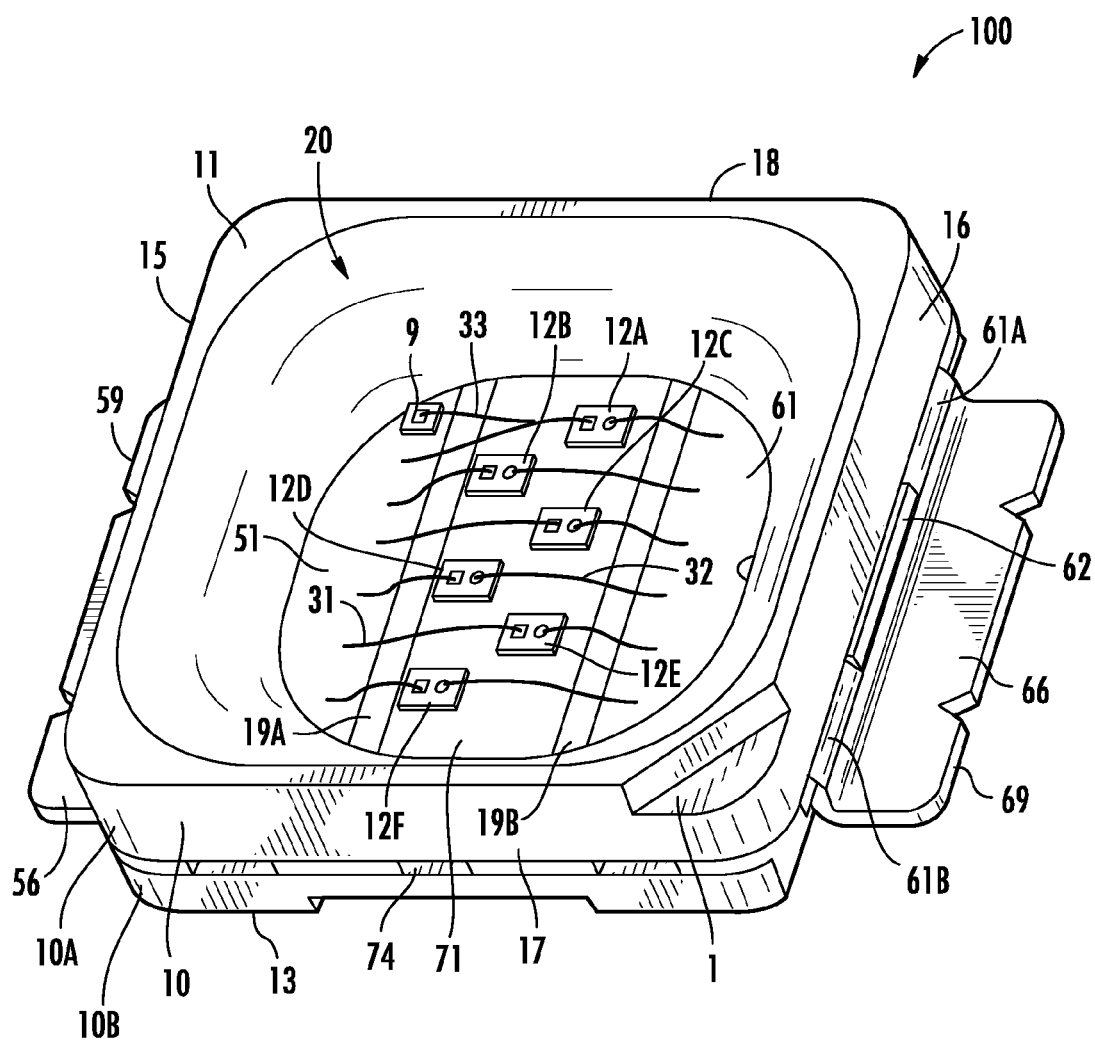
FIG. 1 is a perspective view showing top, side, and end portions of a solid state light emission package according to one embodiment of the present invention.

The present invention now will be described more fully hereinafter with reference to the accompanying drawings, in which embodiments of the invention are shown. The present invention may, however, be embodied in many different forms and should not be construed as limited to the specific embodiments set forth herein. Rather, these embodiments are provided to convey the scope of the invention to those skilled in the art. In the drawings, the size and relative sizes of layers and regions may be exaggerated for clarity.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, no intervening elements are present. It will also be understood that when an element is referred to as being "connected" or "coupled" to another element, it can be directly connected or coupled to the other element or intervening elements may be present. In contrast, when an element is referred to as being "directly connected" or "directly coupled" to another element, no intervening elements are present.

It will be understood that although the terms "first" and "second" are used herein to describe various regions, layers and/or portions, these regions, layers and/or portions should not be limited by these terms. These terms are only used to distinguish one region, layer or portion from another region, layer or portion. Thus, a first region, layer or portion discussed below could be termed a second region, layer or portion, and similarly, a second region, layer or portion may be termed a first region, layer or portion without departing from the teachings of the present invention.

Furthermore, relative terms, such as "lower" or "bottom" and "upper" or "top," may be used herein to describe relationship of one or more elements to another elements as illustrated in the Figures. It will be understood that relative terms are intended to encompass different orientations of the device in addition to the orientation depicted in the Figures. For example, if a device in the Figures is turned over, elements described as being on the "lower" side of other elements would then be oriented on "upper" sides of the other elements. The exemplary term "lower," can therefore, encompasses both an orientation of "lower" and "upper," depending of the particular orientation of the figure. Similarly, if the device in one of the figures is turned over, elements described as "below" or "beneath" other elements would then be oriented "above" the other elements. The terms "below" or "beneath" can therefore encompass both an orientation of above and below.

Unless otherwise defined, terms (including technical and scientific terms) used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

As used herein, the terms solid state light emitter or solid state light emitting device may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the invention may include III-V nitride (e.g., gallium nitride) based LEDs or lasers fabricated on a silicon carbide substrate, such as those devices manufactured and sold by Cree, Inc. of Durham, N.C. Such LEDs and/or lasers may be configured to operate such that light emission occurs through the substrate in a so-called "flip chip" orientation.

Solid state light emitters may be used individually or in combinations, optionally together with one or more luminescent materials (e.g., phosphors, scintillators, lumiphoric inks) and/or filters, to generate light of desired perceived colors (including combinations of colors that may be perceived as white). Inclusion of luminescent (also called 'lumiphoric') materials in LED devices may be accomplished by adding such materials to encapsulants, adding such materials to lenses, or by direct coating onto LEDs. Other materials, such as dispersers and/or index matching materials, may be included in such encapsulants.

Referring now to FIGS. 1-6, a solid state light emitter package 100 according to certain embodiments of the present invention includes a body structure 10 defining a body cavity (preferably reflective to constitute a reflector cavity) 20 containing six solid state emitters 12A-12F. Each emitter 12A-12F is arranged over (i.e., on or adjacent to) the upper surface 71 of a heatsink 70 disposed along the floor of the reflector cavity 20, and each emitter 12A-12F is disposed in electrical communication with a first electrical lead 51 and a second electrical lead 61 using wirebonds 31, 32. In one embodiment, the emitters 12A-12F may be mounted on an optional submount (not shown) arranged between the emitters 12A-12F and the heatsink 70. The heatsink 70 is separated from (and preferably electrically isolated from) the electrical leads 51, 52 via body portions 19A, 19B, and is adapted to conduct heat away from the emitters 12A-12F to a lower surface 72 of the heatsink 70 for dissipation therefrom. An electrostatic discharge protection device 9 (e.g., a zener diode, or alternatively, a ceramic capacitor, transient voltage suppression (TVS) diode, multilayer varistor, and/or Schottky diode) arranged on the first electrical lead 51 and having an associated wirebond 33 is also disposed in electrical communication with the emitters 12A-12F. The electrical leads 51, 61 extend through exterior side walls 15, 16 disposed at opposing ends of the body structure 10, with lead tab portions 56, 66 extending away from the exterior side walls 15, 16 in a direction outward from a center portion of the package 100, to enable the lead tab portions 56, 66 to be soldered or otherwise connected to a current source and sink (not shown) to permit operation of the emitters 12A-12F.

Figure 6:
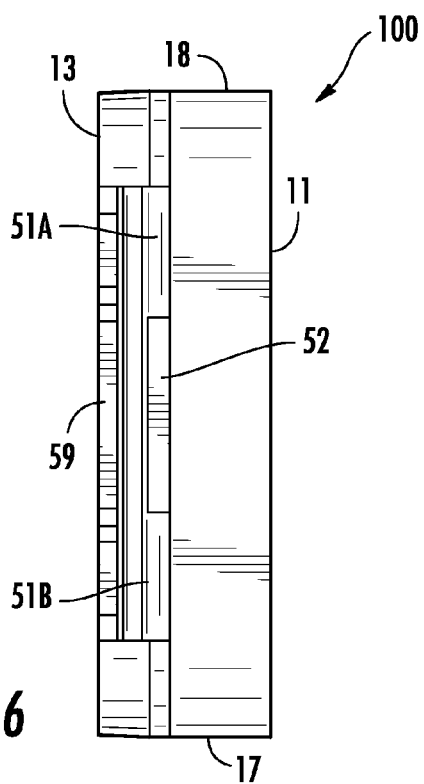
FIG. 6 is an end elevation view of the solid state light emission package of FIGS. 1-5.

The body structure 10 includes an upper face 11, lower face 13, and exterior side walls 15-18. The upper face 11 defines a corner notch 1, and the lower face 13 desirably includes a recess 2 containing the heatsink 70, with a lower surface 72 and lower protrusion 72A of the heatsink 70 being exposed. In one embodiment, the body structure 10 has a length and a width (e.g., as represented by exterior side walls 15-18) that are substantially equal, such that the body structure 10 has a square-shaped footprint. In another embodiments, the length and width of the body structure 10 may be unequal, with the body structure having a rectangular footprint, or the body structure 10 may be formed in other shapes (e.g., round), including footprints conforming to regular polygonal shapes (e.g., octagonal), or footprints of other shapes not constituting regular polygons. The body structure 10 is preferably formed around a leadframe 50 (defining electrical leads 51, 61) and the heatsink 70 (as illustrated in FIG. 6), with the body structure 10 encasing at least a portion of the leadframe 50 and arranged to retain the heatsink element 70. Protruding portions 73, 74 of the heatsink 70 may be exposed along side walls 17, 18 of the body structure 10. The body structure 10 may be advantageously formed using a molding process, such as injection molding, using a thermoplastic and/or thermoset material that is preferably electrically insulating. Polymer-containing materials are desirably used to form the body structure 10, with such materials optionally being reinforced (e.g., with fibers, ceramics, or composites). The body structure may be white or light in color to minimize dark appearance of the package 100. Ceramic and/or composite materials may be utilized in place of polymers to form the body structure 10 in certain embodiments. As an alternative to injection molding, other types of molding and/or forming processes (e.g., sintering) may be used. The body structure 10 may include an upper portion 10A and lower portion 10B (e.g., as may be formed in upper and lower molding die portions (not shown), respectively). The reflector cavity 20 may be formed as the inverse of a central protrusion in an upper molding die.

Figure 3:
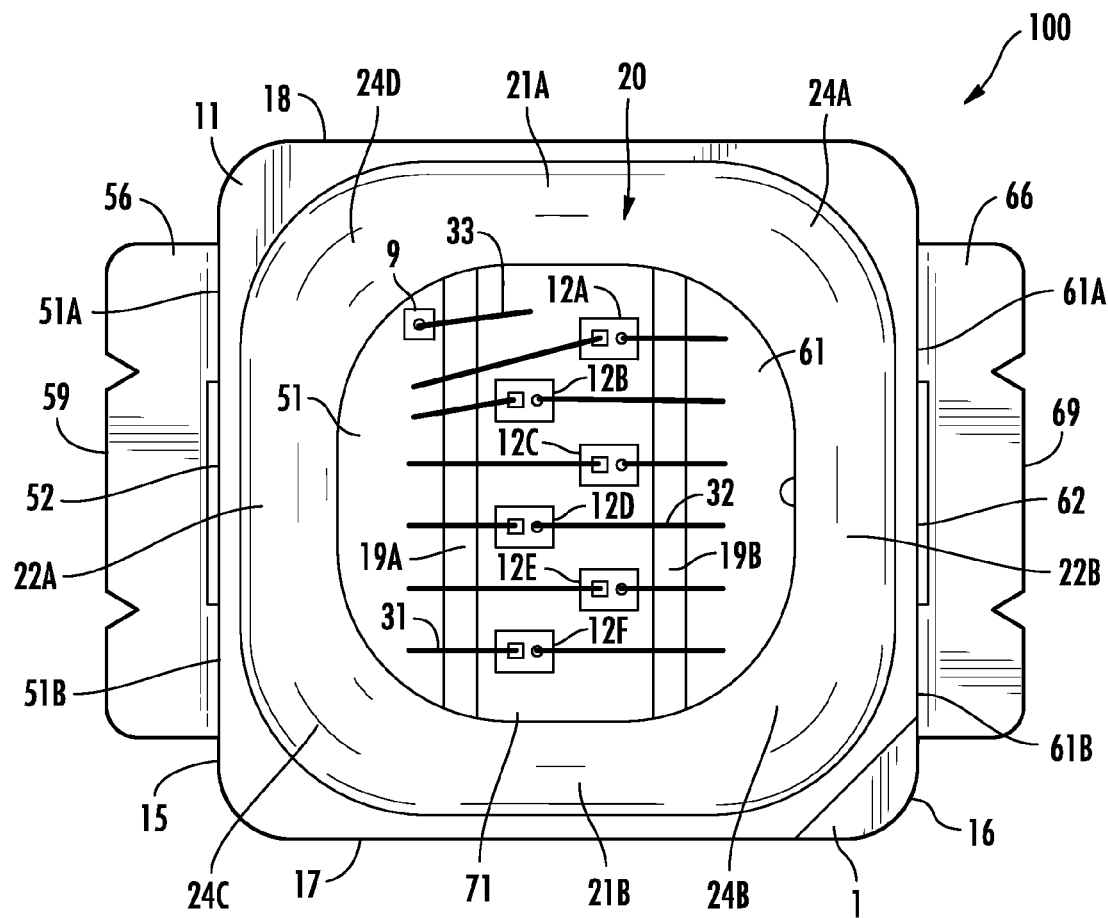
FIG. 3 is a top plan view of the solid state light emission package of FIGS. 1-2.
Figure 7:
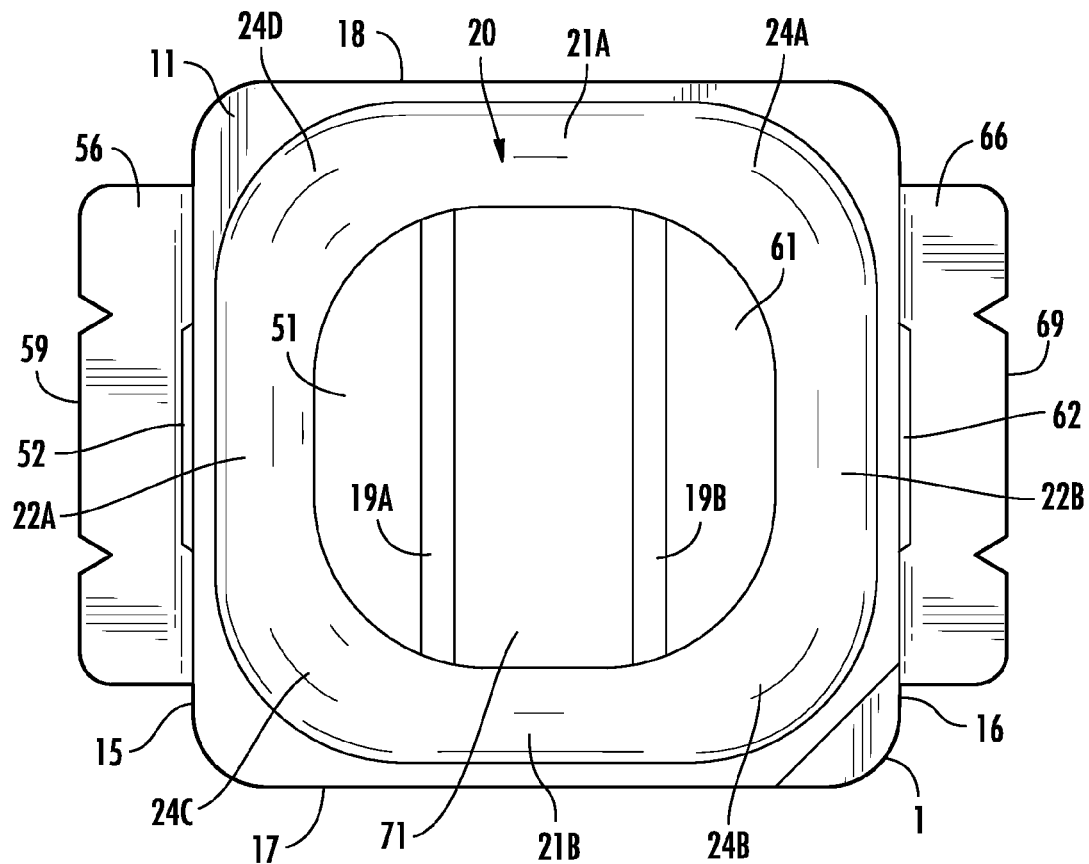
FIG. 7 is a top plan view of a package subassembly prior to complete fabrication of the solid state light emission package of FIGS. 1-6.
Figure 8A:
FIG. 8A is a simplified schematic cross-sectional view of a body portion of the package subassembly of FIG. 7, illustrating the angle of a side wall or end wall portion thereof.
Figure 8B:
FIG. 8B is a simplified schematic cross-sectional view of a body portion of the package subassembly of FIG. 7, illustrating the angle of a transition wall portion thereof.

Referring to FIG. 3 and FIG. 7, the reflector cavity 20 is bounded from below by a floor (including portions of the contacts 51, 61, body portions 19A, 19B, and an upper surface 71 of the heatsink 70), and bounded along edges by side wall portions 21A, 21B, end wall portions 22A, 22B, and transition wall portions 24A-24D. A transition wall portion 24A-24D is disposed between each respective side wall portion 21A, 21B and end wall portion 22A, 22B. Each side wall portion 21A, 21B and each end wall portion 22A, 22B preferably includes a substantially straight upper edge, and each transition wall portion 24A-24D preferably includes a curved or segmented upper edge transitioning from the upper edge of a side wall portion 21A, 21B to the upper edge of an end wall portion 22A, 22B. Each transition wall portion 24A-24D is preferably inclined at a larger average angle, relative to a plane perpendicular to the floor of the reflector cavity, than each side wall portion 21A, 21B and each end wall portion 22A, 22B. For example, FIG. 8A provides a simplified schematic cross-sectional view of a body portion, illustrating the angle θ of a side wall portion or end wall portion thereof relative to a plane perpendicular to the floor of the body cavity. Similarly, FIG. 8B provides a simplified schematic cross-sectional view of a body portion, illustrating the angle φ of a transition wall portion relative to a plane perpendicular to the floor of the body cavity. In one embodiment, each side wall portion and each end wall portion is inclined at an angle θ of at least about 20 degrees; more preferably at least about 30 degrees; still more preferably at least about 40 degrees. In further embodiments, the angle θ may be at least about 45 degrees, or at least about 50 degrees. In one each transition wall portion is inclined at an angle φ of at least about 30 degrees; more preferably at least about 40 degrees; still more preferably at least about 50 degrees. In further embodiments, the angle φ may be at least about 55 degrees, or at least about 60 degrees. Such angles of the side wall portions 21A, 21B, end wall portions 22A, 22B, and transition wall portions 24A, 24D are greater than typically employed in solid state emitter devices. Although the side wall/end wall portions and transition wall portions are illustrated in FIGS. 8A-8B as being angular from the floor of the cavity to the upper edge of the package, in an alternative embodiment any one or more (or all) of these wall portions may be characterized by a segmented and/or curved cross-section, that is, with the wall extending from the floor to the upper edge of the package being non-linear along at least a portion thereof. If such walls are curved or segmented, then the inclination angles mentioned above may correspond to an average angle of a curved or segmented wall, or an angle between endpoints of such a wall. Use of side wall portions 21A, 21B/end wall portions 22A, 22B and transition wall portions 24A-24D of alternating angles enables frontal area of the reflector cavity 20 maximized relative to the square-shaped upper surface 11, while providing desirably diffuse output beam characteristics, particularly when multiple emitters are disposed in the cavity 20.

Figure 10:
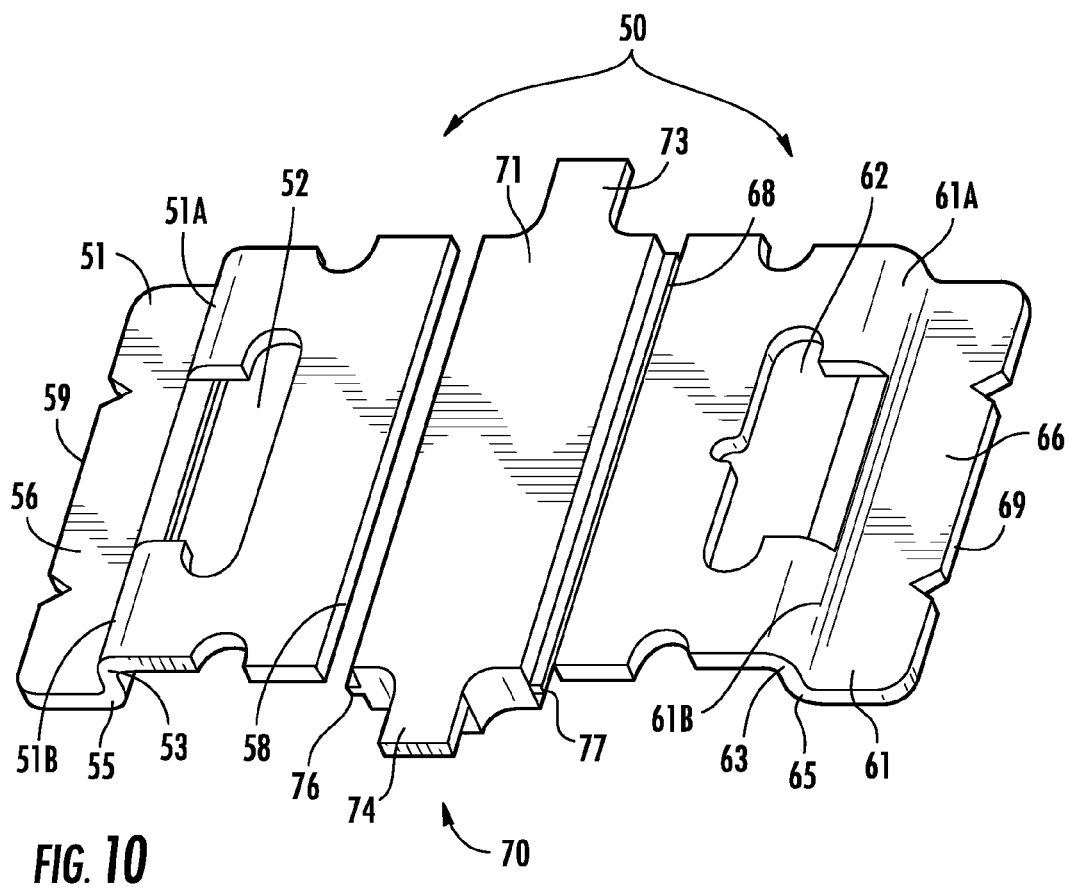
FIG. 10 is a perspective view showing top, side, and end portions of a leadframe and heatsink of the solid state light emission package of FIGS. 1-6 and the package subassembly of FIGS. 7-8.
Figure 11:
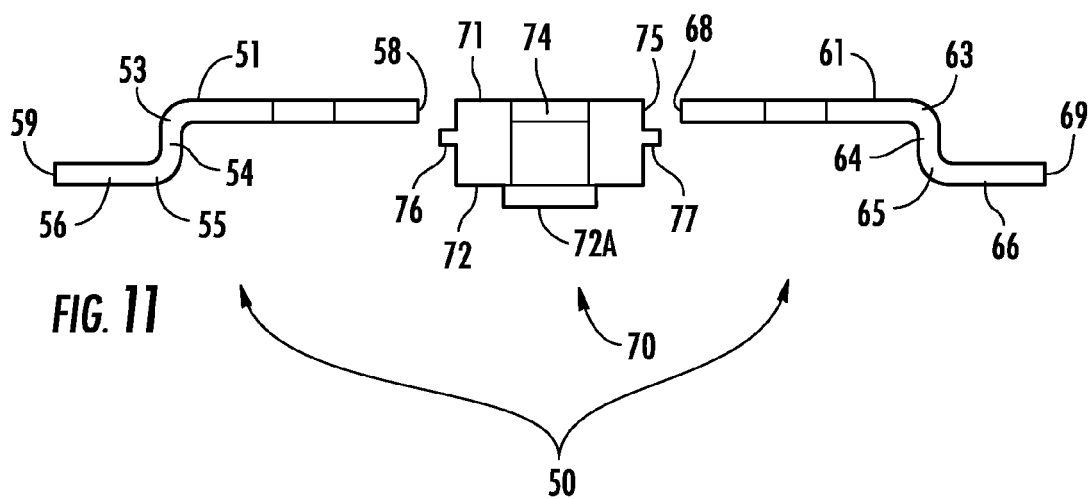
FIG. 11 is a side elevation view of the leadframe and heatsink of FIG. 10.

As indicated previously, the body structure 10 is preferably formed around the leadframe 50 and heatsink 70. Referring to FIGS. 10-11, the leadframe 50 includes a first electrical lead 51 and a second electrical lead 61. Each electrical lead 51, 61 includes a medial end 58, 68, and a lead tab portion 56, 66 extending away from a center of the emitter package and terminating at a distal end 59, 69. Each electrical lead 51, 61 defines at least one aperture 52, 62 that serves to separate multiple electrical lead segments 51A-51B, 61A-62B. In one embodiment, each electrical lead 51, 61 may include multiple apertures serving to separate more than two (e.g., three or more) electrical lead segments. A portion of each aperture 52, 62 is preferably filled with body material of the body structure, with another portion of each aperture 52, 62 being disposed outside the side walls 15, 16 of the body structure 10, such that individual electrical lead segments 51A-51B, 61A-61B are separated from corresponding electrical lead segments 51A-51B, 61A-61B by the apertures 52, 62 along exterior side walls 15, 16 of the body structure 10. Each electrical lead 51, 61 includes a first bend 53, 63, a bent portion 54, 64 (that is preferably substantially perpendicular to a plane extending through the medial ends 58, 68), and a second bend 55, 65 transitioning to each electrical lead tab portion 56, 66. Each aperture 52, 62 preferably extends at least into each first bend 53, 63. Each aperture 52, 62 provides multiple benefits. First, a medial portion of each aperture 52, 62 is filled with body material, and thus serves to promote secure retention of the electrical leads 51, 61 within the body structure 10. Second, each aperture 52, 62 serves to reduce the amount of lead material (e.g., metal) subject to being bent to form the first bend 53, 63. This reduces the amount of bending force required to form the first bend 53, 63, as is particularly desirable when the first bend 53, 63 is formed in each electrical lead 51, 61 after formation of the body structure 10 around the electrical leads 51, 61. Bending is preferably performed sufficiently to position at least a portion of each electrical lead 51, 61 in the recesses 5, 6.

Figure 2:
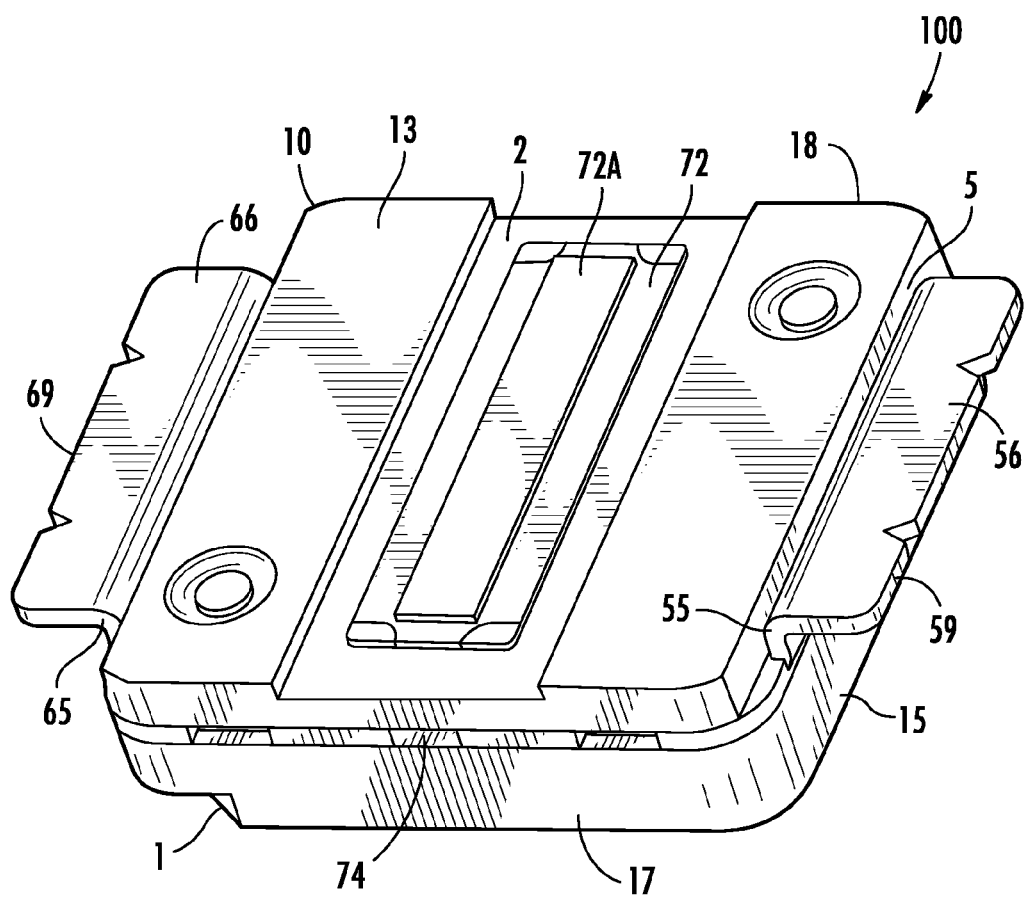
FIG. 2 is a perspective view showing bottom, side, and end portions of the solid state light emission package of FIG. 1.
Figure 4:
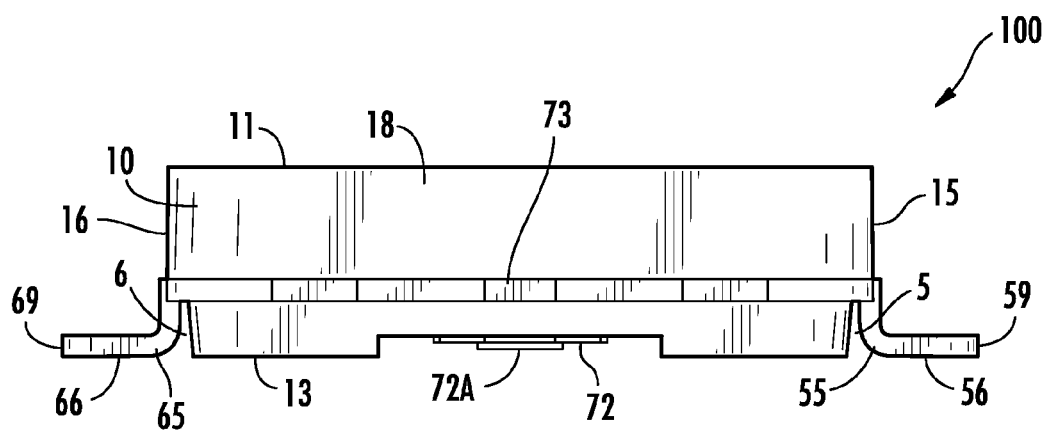
FIG. 4 is a side elevation view of the solid state light emission package of FIGS. 1-3.
Figure 9:
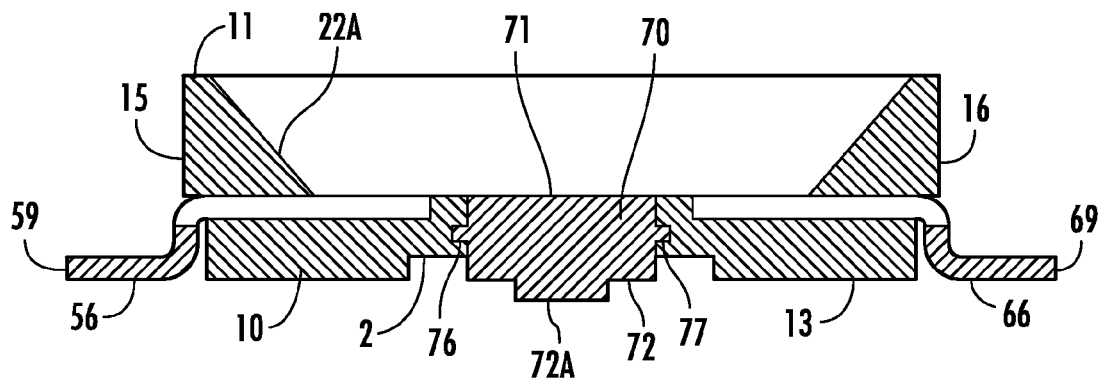
FIG. 9 is a side cross-sectional view of the subassembly of FIG. 7.

Continuing to refer to FIGS. 10-11, the heatsink 70 includes an upper surface 71, a lower surface 72 including a downwardly-extending central protrusion 72A. The heatsink 70 defines upper protrusions 73, 74 along ends of the upper surface 71, with such upper protrusions 73, 74 extending through side walls of the body structure 10 (as illustrated in FIGS. 1, 2, and 4) and being exposed along tips thereof. Side walls 75 of the heatsink 70 further define protrusions 76, 77 that promote secure retention of the heatsink 70 by the body structure 20 (as illustrated in FIG. 9), and also reduces potential for leakage (e.g., of solder during manufacture of the emitter package 100, or of encapsulant (not shown) disposed in the cavity 20 during operation of the emitter package 100) along interfaces between the body structure 10 and the heatsink 70. Such protrusions 76, 77 along side walls 75 of the heatsink 70 may be varied in number, size, shape, and orientation (e.g. angled upward or downward).

The leadframe 50 may be stamped from a first flat sheet of metal or other conductive material. The heatsink 70 may be stamped from a second flat sheet of metal or other conductive material, with the second sheet preferably being thicker than the first sheet to enable the resulting heatsink 70 to have a substantially greater average thickness than the electrical leads 51, 61. Relative to an average thickness of the electrical leads 51, 61, an average thickness of the heatsink 70 is preferably at least two times as thick, and more preferably at least about 2.5 times as thick. A multitude of leadframes may be defined in a single first sheet, and a multitude of heatsinks may be defined in a second sheet, and body structure material may be formed around such first and second sheets to simultaneously form a multitude of emitter package subassemblies (e.g., such as the individual subassembly shown in FIGS. 8-9). Bends 53, 54, 63, 64 may be defined in electrical leads 51, 61 of each package subassembly after formation of the body structure. The multitude of emitter package subassemblies may be separated into individual package subassemblies by cutting adjacent to side walls 17, 18 and distal ends 59, 69 of the lead tab portions 56, 66. Such cutting exposes tips of the heatsink protrusions 73, 74 along side walls 17, 18 of each emitter package 100.

Figure 5:
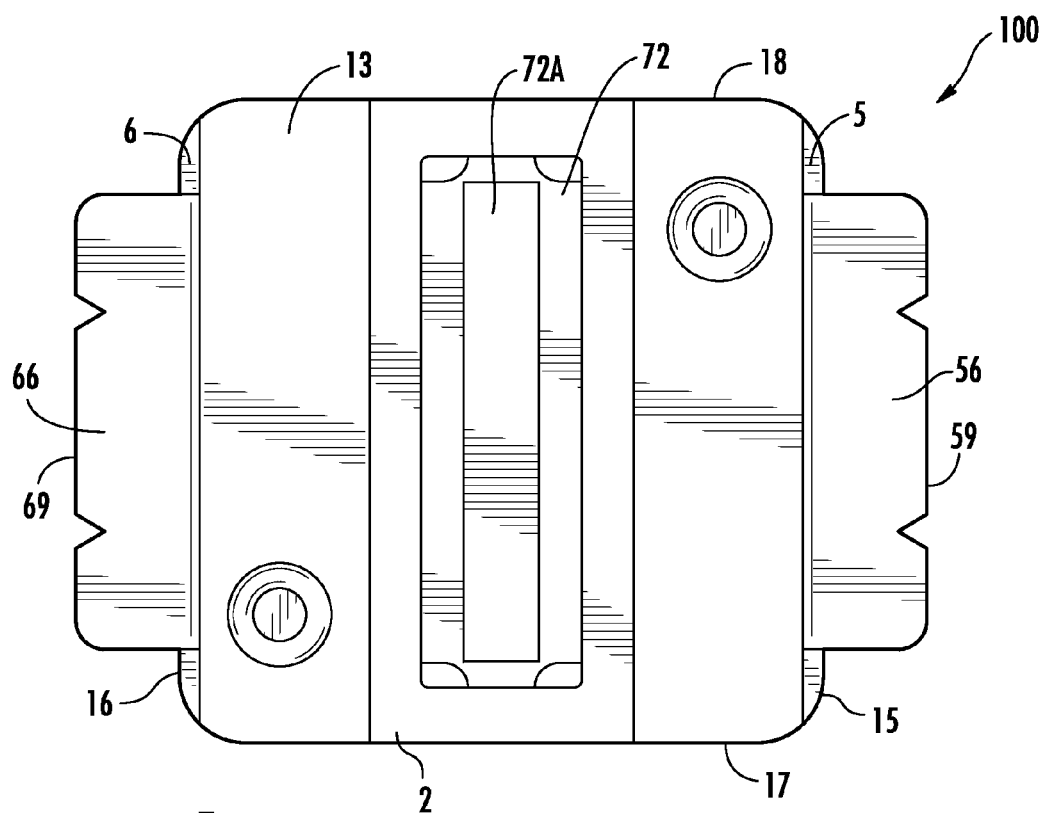
FIG. 5 is a bottom plan view of the solid state light emission package of FIGS. 1-4.

Referring to FIGS. 2, 4, and 5, recesses 5, 6 are preferably defined in exterior side walls 15, 16 of the body structure 10 adjacent to (e.g., below) locations where the leads 51, 61 extend through the exterior side walls 15, 16. Such recesses 5, 6 are preferably arranged to receive the bent portion (or at least part of the thickness of the bent portion) of each electrical lead 51, 61. Each recess 5, 6 has a depth relative to the corresponding exterior side wall 15, 16, with the depth of each recess 5, 6 preferably being at least as large as an average thickness of the electrical leads 51, 61. The recesses 5, 6 provide multiple benefits. First, the recesses 5, 6 eliminate presence of material immediately disposed below the first bends 53, 63, thereby reducing stress applied to the body structure 10 when the first bends 53, 63 are formed after the leadframe 50 (including electrical leads 51, 61) is retained in the body structure 10. Second, the recesses 5, 6 enable each first bend 53, 63 to have a tighter bending radius and reduce or eliminate outward extension of the bent portions 54, 64 (preferably substantially perpendicular to the lower body surface 13 and the electrical lead tab portions 56, 66) relative to the side walls 15, 16, thereby reducing the effective footprint of the light emission package 100. Reduction of effective footprint of emitter packages 100 enables such packages 100 to be mounted at higher density on an underlying substrate (not shown), and optionally overlaid with a Lambertian reflector or diffuser having reduced hole spacing (e.g., within a backlit display device, such as a LCD display), thereby enhancing lighting performance such as by enabling higher flux density and/or greater lighting uniformity.

Figure 12A:
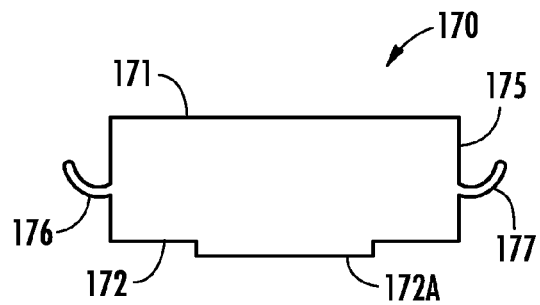
FIG. 12A is a cross-sectional schematic view of a heatsink according to one embodiment and useable with a solid state light emission package as disclosed herein.
Figure 12B:
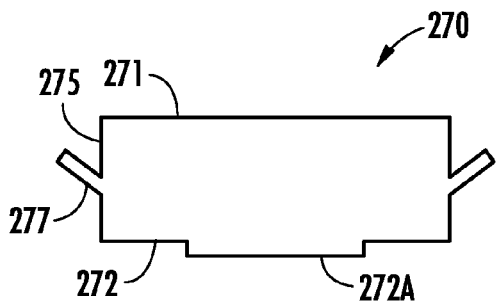
FIG. 12B is a cross-sectional schematic view of a heatsink according to another embodiment and useable with a solid state light emission package as disclosed herein.
Figure 12C:
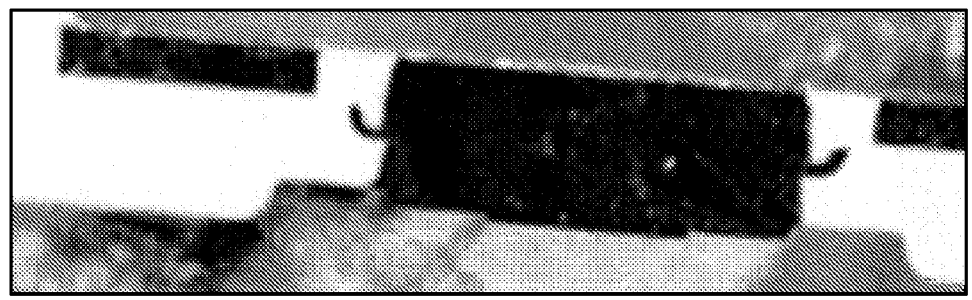
FIG. 12C is a cross-sectional view of a portion of a solid state light emission package according to one embodiment of the present invention, showing a heatsink similar to the embodiment illustrated in FIG. 12A.

Referring to FIG. 12A, in one embodiment a heatsink 170 for integration and use with a solid state emitter package (e.g., package 100) may include an upper surface 171, a lower surface 172, a lower protruding portion 172A, and curved lateral protrusions 176, 177 extending outward from side walls 175. A photograph showing a cross-section of a heatsink with similarly curved lateral protrusions is shown in FIG. 12C. Referring to FIG. 12B, in another embodiment a heatsink 270 may include an upper surface 271, a lower surface 272, a lower protruding portion 272A, and upwardly-angled lateral protrusions 276, 277 extending outward and upward from side walls 275. Downwardly-angled lateral protrusions may be employed in a similar embodiment (not shown). Any combinations of the foregoing lateral protrusions may be employed. Lateral protrusions may be formed by any suitable manufacturing method, including stamping, extrusion, milling, and the like. In further embodiments, the lateral protrusions may be replaced with, or supplemented by, recesses (not shown) in side walls of a heatsink to provide similar sealing utility, with such recesses being formable by similar methods.

Figure 13:
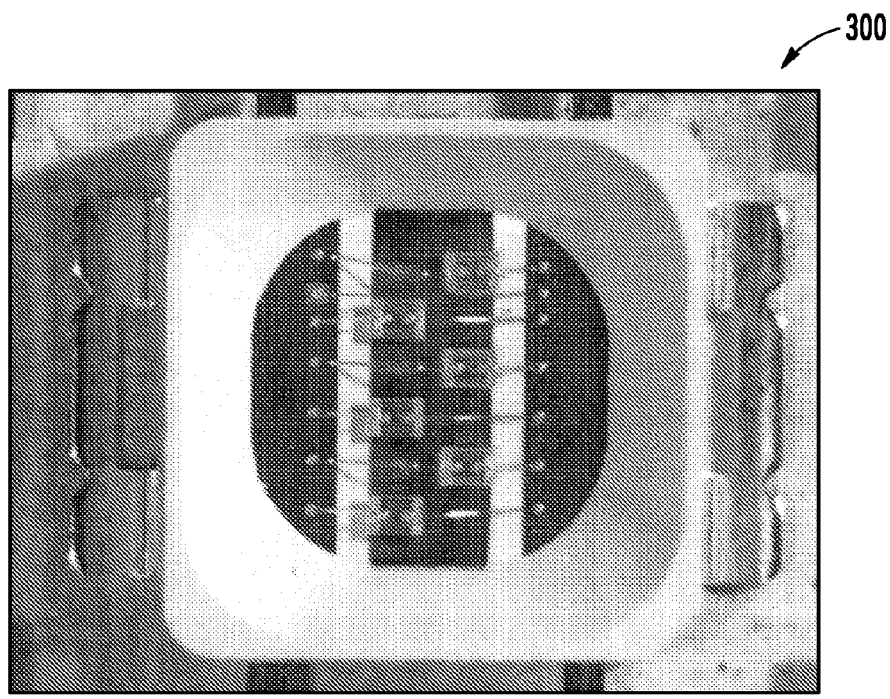
FIG. 13 is a top plan view of a solid state light emission package according to another embodiment of the present invention, the package lacking encapsulant in the reflector cavity for clarity of illustration.

FIG. 13 shows a top plan view photograph of a solid state emitter package 300 similar to the package 100 described hereinabove. To promote ease of viewing, such package 300 is devoid of encapsulant, diffuser, and/or lens material (as otherwise may be retained in the cavity to cover/protect the emitters and wirebonds, and to optionally interact with light emitted by the emitters), but it is to be understood that emitter packages as disclosed herein may desirably include encapsulant, diffuser and/or lens material, optionally including at least one lumiphor to interact with light emitted by the emitters and responsively emit light of a different wavelength. The package 300 according to the present embodiment differs from the package 100 according to a prior embodiment with respect to layout of the wirebonds (e.g., the wirebond of the electrostatic discharge device may extend to a second contact, rather than contacting a wirebond for an emitter), and with respect to size of the apertures defined in the electrical leads.

As compared to the apertures 52, 62 defined in the electrical leads 51, 61, the apertures shown in FIG. 13 are larger.

Figure 14A:
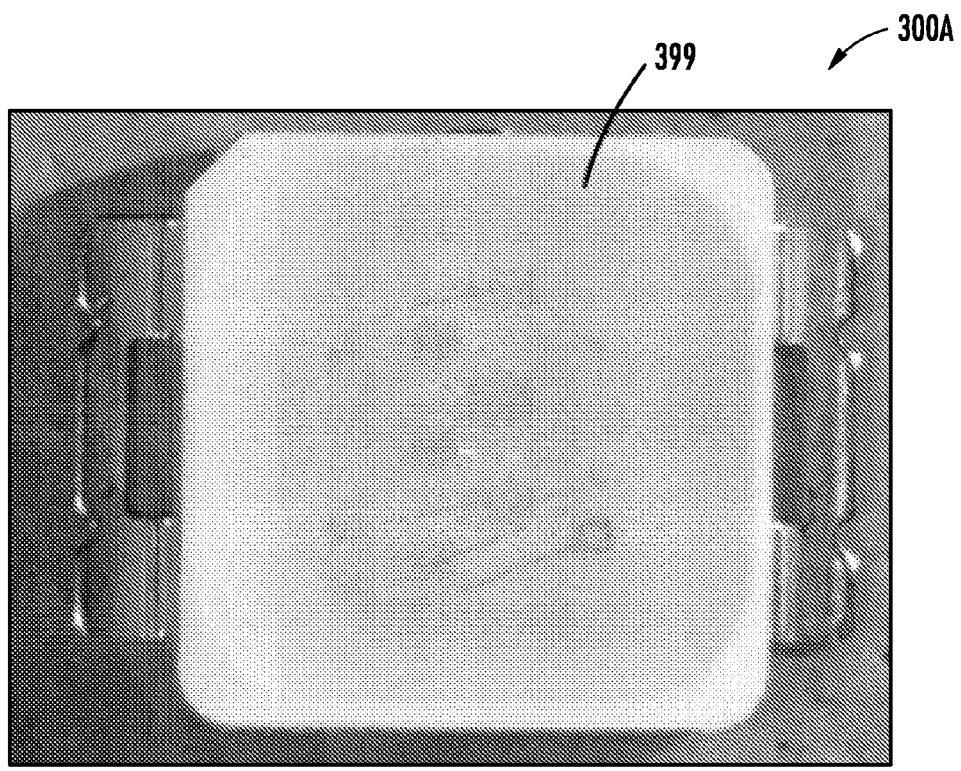
FIG. 14A is a top plan view of a solid state light emission package similar to the package of FIG. 13, but including encapsulant in the reflector cavity.
Figure 14B:
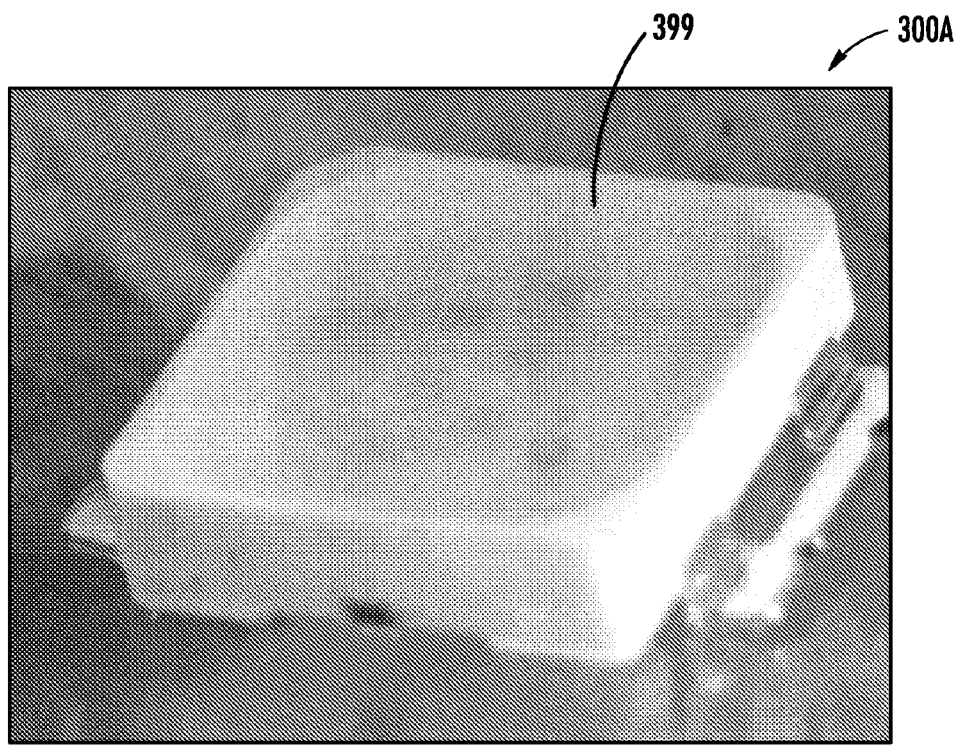
FIG. 14B is a perspective view showing top, side, and end portions of the solid state light emission package of FIG. 14A.

FIGS. 14A-14B depict a solid state light emission package 300A similar to the package 300 depicted in FIG. 13, but the package 300A includes encapsulant material 399 disposed within the cavity containing the emitters, and the wirebond arrangement in the package 300 differs from wirebond arrangements shown in prior embodiments.

One or more solid state emitter packages as described herein may be integrated into lighting apparatuses of varying type, including LCD displays and backlights therefor. In one embodiment, an enclosure comprises an enclosed space and at least one solid state emitter package or lighting device as disclosed herein, wherein upon supply of current to a power line, the at least one lighting device illuminates at least one portion of the enclosed space. In another embodiment, a structure comprises a surface and at least one solid state emitter package or lighting device as disclosed herein, wherein upon supply of current to a power line, the lighting device illuminates at least one portion of the surface. In another embodiment, a solid state emitter package or lighting device as disclosed herein may be used to illuminate an area comprising at least one of the following: a swimming pool, a room, a warehouse, an indicator, a road, a vehicle, a road sign, a billboard, a ship, a toy, an electronic device, a household or industrial appliance, a boat, and aircraft, a stadium, a tree, a window, a yard, and a lamppost.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A light emission package adapted for use with at least one solid state emitter, the package comprising:
    a leadframe comprising a plurality of electrical leads;
    a body structure encasing at least a portion of the leadframe, the body structure comprising at least one exterior side wall;
    a heatsink retained by the body structure, and the heatsink being electrically isolated from each of the electrical leads; and
    wherein a first of the plurality of electrical leads comprises a plurality of first electrical lead segments extending through the at least one exterior side wall from a center portion of the body structure; and
    wherein each first electrical lead segment is separated from each other first electrical lead segment along the at least one exterior side wall by at least one first aperture, and at least a portion of the at least one aperture is disposed outside the at least one exterior wall.

2. The light emission package of claim 1, wherein the at least a portion of the at least one first aperture is filled with body material within the body structure.

3. The light emission package of claim 1, wherein the plurality of electrical leads comprises a second electrical lead, and the second electrical lead includes a plurality of second electrical lead segments extending through the at least one exterior side wall, wherein each second electrical lead segment is separated from each other second electrical lead segment along the exterior side wall by at least one second aperture, and at least a portion of the at least one second aperture is disposed outside the at least one exterior wall.

4. The light emission package of claim 3, wherein the first electrical lead extends through a first exterior side wall of the at least one exterior side wall, and the second electrical lead extends through a second exterior side wall of the at least one exterior side wall.

5. The light emission package of claim 1, wherein the at least one electrical lead comprises a bent portion.

6. The light emission package of claim 5, wherein the at least one exterior side wall defines at least one recess arranged to receive the bent portion of the at least one electrical lead.

7. The light emission package of claim 1, wherein the body structure defines a cavity, and the package further comprises at least one solid state emitter disposed within the cavity.

8. The light emission package of claim 7, comprising an electrostatic discharge protection device in electrical communication with the at least one solid state emitter.

9. The light emission package of claim 7, further comprising a submount, wherein the at least one solid state emitter is mounted to the submount.

10. A lighting apparatus comprising at least one light emission package according to claim 1.

11. A light emission package adapted for use with at least one solid state emitter, the package comprising:
    a leadframe comprising a plurality of electrical leads;
    a body structure encasing at least a portion of the leadframe, the body structure defining at least one exterior side wall;
    a heatsink retained by the body structure, and the heatsink being electrically isolated from the electrical leads;
    wherein at least a portion of a first electrical lead of the plurality of electrical leads extends through the at least one exterior side wall; and
    wherein the at least one exterior side wall defines at least one recess arranged to receive a bent portion of the first electrical lead.

12. The light emission package of claim 11, wherein the first electrical lead extends through a first exterior side wall of the at least one exterior side wall, and the plurality of electrical leads comprises a second electrical lead extending through a second exterior side wall of the at least one exterior side wall.

13. The light emission package of claim 11, wherein:
    the first electrical lead of the at least one electrical lead comprises a plurality of first electrical lead segments extending through the at least one exterior side wall, wherein each first electrical lead segment is separated from each other first electrical lead segment along the at least one exterior side wall by at least one first aperture, and at least a portion of the at least one first aperture is disposed outside the at least one exterior wall.

14. A lighting apparatus comprising at least one light emission package according to claim 11.

15. A method for fabricating the light emission device of claim 1, the method comprising:
    defining in the leadframe at least one first aperture to yield the plurality of first electrical lead segments;
    forming a body structure to (i) encase at least a portion of the leadframe and (ii) form the at least one exterior side wall; and
    bending the plurality of first electrical lead segments.

16. A method for fabricating the light emission package of claim 11, the method comprising:
    forming the body structure to (i) encase at least a portion of the leadframe and (ii) form the at least one exterior side wall; and bending the at least one electrical lead to position at least a portion of the at least one electrical lead within the at least one recess.

17. The light emission package of claim 6, wherein the recess arranged to receive the bent portion comprises a depth relative to the exterior side wall.

18. The light emission package of claim 11, wherein the first electrical lead extends from a center portion of the body structure.

19. The light emission package of claim 18, wherein the recess is located adjacent to where the first electrical lead extends from the body structure, and the recess comprises a depth relative to the exterior side wall.

20. A light emission package adapted for use with at least one solid state emitter, the package comprising:

a leadframe comprising a plurality of electrical leads, wherein at least one electrical lead comprises a bent portion;

a body structure encasing at least a portion of the leadframe, the body structure comprising at least one exterior side wall, the exterior side wall comprising at least one recess arranged to receive the bent portion of the at least one electrical lead;

a heatsink retained by the body structure, and the heatsink being electrically isolated from each of the electrical leads; and wherein a first of the plurality of electrical leads comprises a plurality of first electrical lead segments extending through the at least one exterior side wall from a center portion of the body structure.

* * * * *